United States Patent
Huang et al.

(10) Patent No.: US 8,242,824 B1
(45) Date of Patent: Aug. 14, 2012

(54) SIGNAL DELAY APPARATUS FOR PROVIDING EXACT DELAY AMOUNT, MEMORY APPARATUS UTILIZING THE SIGNAL DELAY APPARATUS, AND SIGNAL DELAY METHOD

(75) Inventors: Yen-Yin Huang, Taoyuan County (TW); Chih-Hsien Lin, Hsinchu County (TW); Chauo-Min Chen, Kaohsiung (TW); Ming-Shih Yu, Taipei County (TW)

(73) Assignee: Faraday Technology Corp., Science-Based Industrial Park, Hsin-Chu (TW)

(*) Notice: Subject to any disclaimer, the term of this patent is extended or adjusted under 35 U.S.C. 154(b) by 76 days.

(21) Appl. No.: 13/015,595

(22) Filed: Jan. 28, 2011

(51) Int. Cl.
*H03L 7/00* (2006.01)

(52) U.S. Cl. ........................................ 327/161; 327/261

(58) Field of Classification Search .................. None
See application file for complete search history.

(56) References Cited

U.S. PATENT DOCUMENTS

| | | | |
|---|---|---|---|
| 4,795,923 A | 1/1989 | Dobos | |
| 5,923,715 A * | 7/1999 | Ono | 375/376 |
| 6,137,734 A | 10/2000 | Schoner | |
| 7,394,424 B1 * | 7/2008 | Jelinek et al. | 342/375 |
| 7,557,623 B2 * | 7/2009 | Moehlmann et al. | 327/156 |
| 2010/0090876 A1 * | 4/2010 | Taft et al. | 341/166 |

\* cited by examiner

*Primary Examiner* — Cassandra Cox
(74) *Attorney, Agent, or Firm* — Winston Hsu; Scott Margo

(57) ABSTRACT

A signal delay apparatus, including: a period digitalization circuit, for digitalizing a period of a reference clock signal to generate a digitalized reference period; a delay control signal generator, for generating a delay control signal according to the digitalized reference period, a reference frequency and a required delay indicating signal; and a delay circuit, for delaying an input signal to generate an output signal according to the required delay control signal.

21 Claims, 7 Drawing Sheets

SIGNAL DELAY APPARATUS FOR PROVIDING EXACT DELAY AMOUNT, MEMORY APPARATUS UTILIZING THE SIGNAL DELAY APPARATUS, AND SIGNAL DELAY METHOD

BACKGROUND OF THE INVENTION

1. Field of the Invention

The present invention relates to a signal delay apparatus, a memory apparatus that utilizes this signal delay apparatus and a signal delay method, and more particularly, to a signal delay apparatus capable of providing an exact delay amount, a memory apparatus that utilizes this signal delay apparatus and a signal delay method thereof.

2. Description of the Prior Art

FIG. 1 shows a memory apparatus 100 according to the prior art. As shown in FIG. 1, the conventional memory apparatus 100 includes a memory module 101 and a control circuit 103. The control circuit 103 accesses (reads/writes) the memory chips 105-111 via signal channels 113-119. In earlier electronic apparatuses, four-layer circuit boards are utilized, so there is enough room between each signal channel line, power line and ground line. Therefore, there is no problem resulted from mismatch between signal channel lines. However, in order to decrease size and reduce cost of the electronic apparatus, two-layer circuit boards are commonly used. As a result, the signal channel lines, the power lines, the ground lines, etc. will be hard to place and route balanced, so there is a problem resulted from the mismatch between signal channel lines.

A lot of techniques are developed to solve this problem. For example, U.S. Pat. No. 4,795,923 teaches performing compensation for signal mismatch according to analog signals. Besides, U.S. Pat. No. 6,137,734 teaches selecting a correct compensation route by continuous try-and-error.

However, these techniques have shortcomings. For example, it is difficult to control the analog signal. When the compensation is realized by means of continuous try-and-error, it is time-consuming and requires a large circuit area.

SUMMARY OF THE INVENTION

Therefore, one of the objectives of the present invention is to provide a signal delay apparatus capable of providing an exact delay amount and capable of being controlled simply and a signal delay method thereof.

An exemplary embodiment of the present invention discloses a signal delay apparatus, including: a period digitalization circuit, for digitalizing a period of a reference clock signal to generate a digitalized reference period; a delay control signal generator, for generating a delay control signal according to the digitalized reference period, a reference frequency and a required delay indicating signal; and a delay circuit, for delaying an input signal to generate an output signal according to the required delay control signal.

Another exemplary embodiment of the present invention discloses a memory apparatus, including: a plurality of memory chips; a control circuit; a plurality of signal channels, wherein the control circuit communicates with the memory chips via the signal channels; a delay control circuit, for synchronizing signal transmissions of the signal channels. The delay control circuit includes: a period digitalization circuit, for digitalizing a period of a reference clock signal to generate a digitalized reference period; a delay control signal generator, for generating a delay control signal according to the digitalized reference period, a reference frequency and a required delay indicating signal; and a delay circuit, for delaying an input signal from a signal channel of the signal channels to generate an output signal to the signal channel according to the delay control signal.

Yet another exemplary embodiment of the present invention discloses a signal delay method, including: digitalizing a period of a reference clock signal to generate a digitalized reference period; generating a delay control signal according to the digitalized reference period, a reference frequency and a required delay indicating signal; and controlling a delay circuit according to the delay control signal, for delaying an input signal to generate an output signal.

According to the aforementioned exemplary embodiments, the digitalization control circuit may provide an exact delay value, and may simultaneously utilize a plurality of delay circuits and a plurality of delay control signals to control respective delay circuits. Moreover, by utilizing this mechanism, the delay circuit may not be limited to be disposed close to the delay control circuit for decreasing interference between signal transmissions, thereby improving flexibility in circuit design and decreasing the circuit area.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is electrically connected to another device, that connection may be through a direct electrical connection, or through an indirect electrical connection via other devices and connections.

Figure 2:
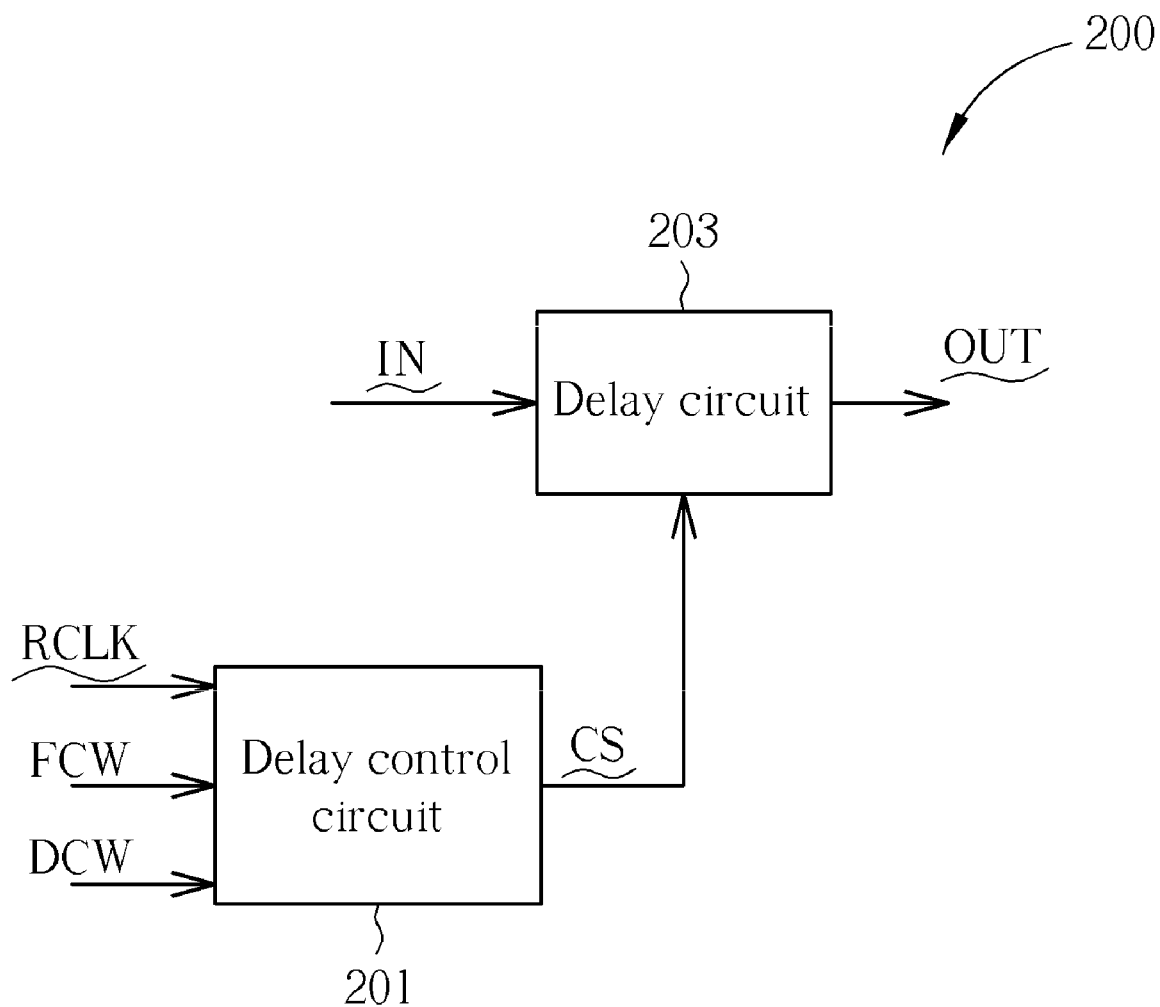
FIG. 2 shows a signal delay apparatus according to an exemplary embodiment of the present invention.

FIG. 2 shows a signal delay apparatus 200 according to an exemplary embodiment of the present invention. As shown in FIG. 2, the signal delay apparatus 200 includes a delay control circuit 201 and a delay circuit 203. The delay control circuit 201 receives a reference clock signal RCLK and a required delay indicating signal DCW. The required delay indicating signal DCW in this embodiment is a word code status. A delay control signal CS is generated according to a reference frequency FCW (also a word code status in this embodiment) of the reference clock signal RCLK and the required delay indicating signal DCW. The delay circuit 203 is utilized for delaying an input signal IN to generate an output signal OUT according to the delay control signal CS. The reference frequency FCW may be known in advance, or may be calculated after the reference clock signal RCLK is input into the delay control circuit 201. The required delay indicating signal DCW may be a desired delay value directly input into the delay control signal generator 303 in the word code form. Alternatively, the required delay indicating signal DCW is generated by inputting a desired delay value into a mapping table (which may be stored in a memory device). Therefore, the required delay value of the delay circuit 203 may be exactly controlled. In an exemplary embodiment, the delay circuit 203 includes a plurality of programmable buffers, and the control signal CS is a control code or a plurality of control codes, where the respective control signals CS are generated by different required delay indicating signals DCW for controlling respective buffers. However, it is not meant to be a limitation of the present invention. These buffers may belong to the same signal channel, or belong to different signal channels.

Figure 3:
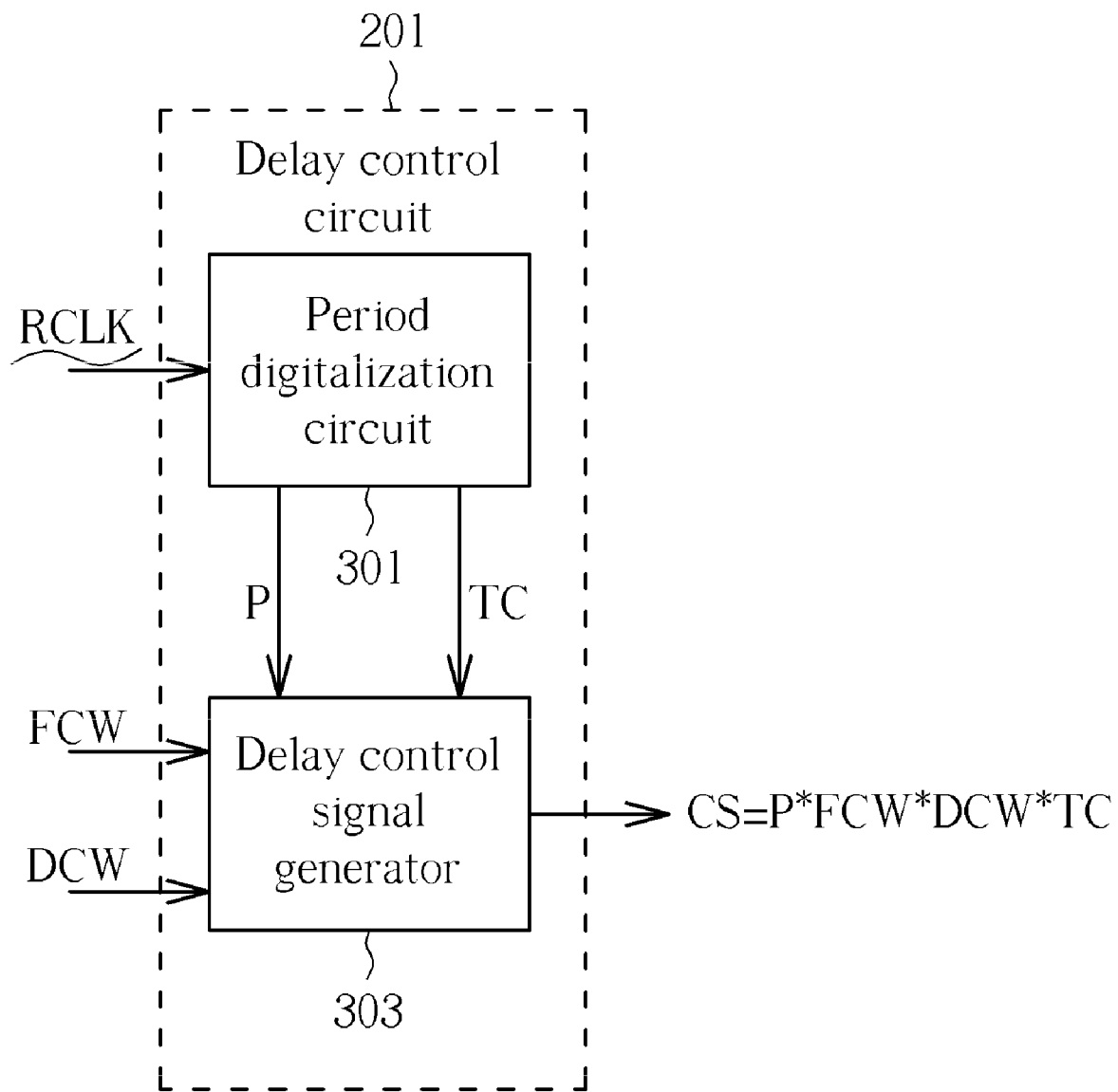
FIG. 3 shows an exemplary implementation of the delay control circuit shown in FIG. 2.

FIG. 3 shows an exemplary implementation of the delay control circuit 201 shown in FIG. 2. As shown in FIG. 3, the delay control circuit 201 includes a period digitalization circuit 301 and a delay control signal generator 303. The period digitalization circuit 301 is utilized for digitalizing a period of the reference clock signal RCLK to generate a digitalized reference period P. The delay control signal generator 303 is utilized for generating the delay control signal CS according to the digitalized reference period P, the reference frequency FCW and the required delay indicating signal DCW. In detail, after the delay control circuit 201 digitalizes the period of the reference clock signal RCLK to a data P, the delay control circuit 201 generates the control signal CS according to a ratio of the required delay value to the period of the reference clock signal RCLK. One of the feasible manners of generating the control signal CS is to multiply the digitalized reference period P with the reference frequency FCW and the required delay indicating signal DCW.

In another exemplary embodiment, the period digitalization circuit 301 further provides a ratio parameter TC. The ratio parameter TC represents a ratio of the delay stage in period digitalization circuit to a delay amount of a delay stage of the delay circuit 203. If the delay stage of Period digitalization circuit 301 is the same as the delay amount of the delay stage of the delay circuit 203, the ratio parameter TC may be set by 1. However, in this exemplary embodiment, the manner of generating the control signal CS is to multiply the digitalized reference period P with the reference frequency FCW, the required delay indicating signal DCW and the ratio parameter TC.

Figure 4:
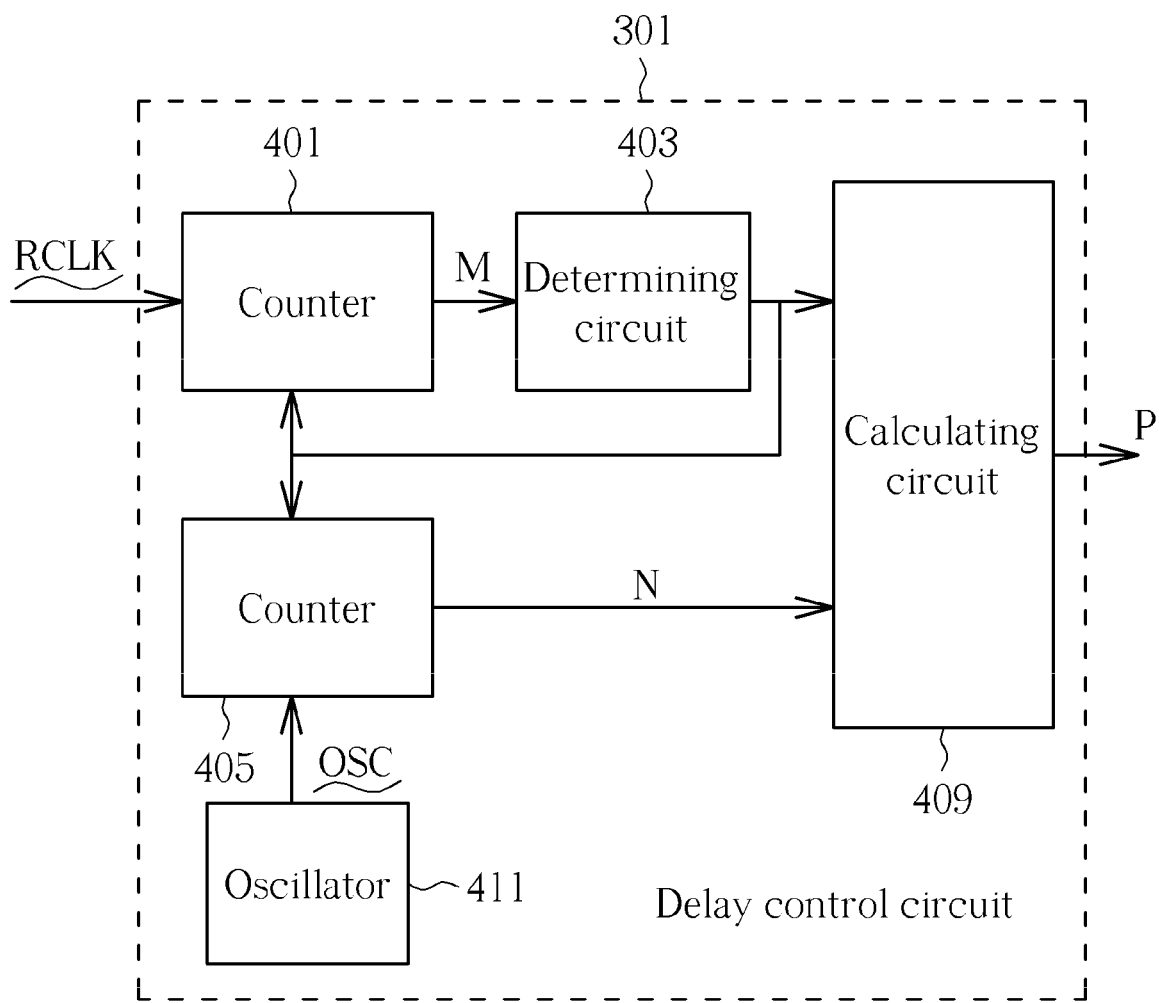
FIG. 4 shows one demonstrative structure of the period digitalization circuit shown in FIG. 3.
Figure 5:
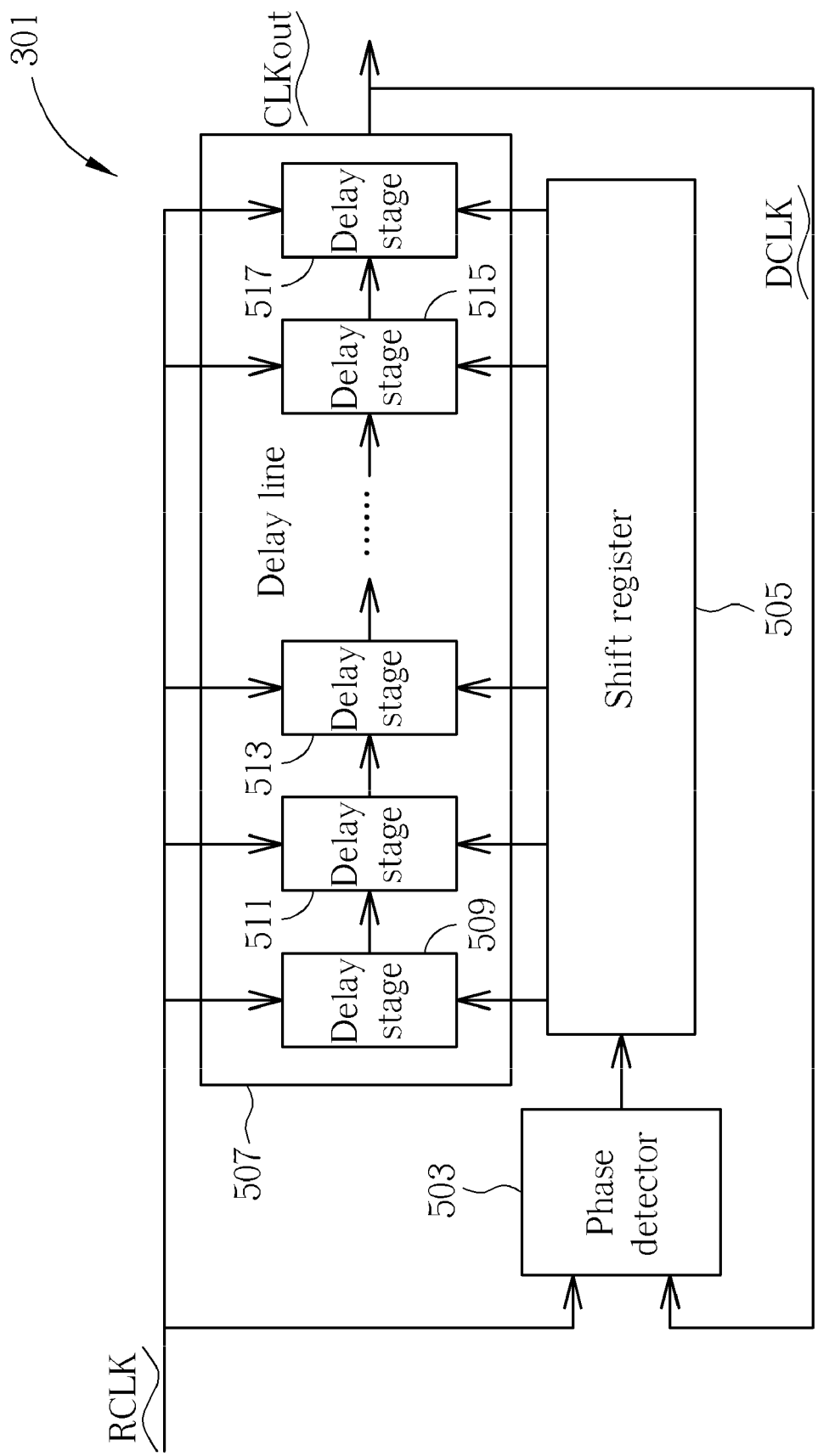
FIG. 5 shows another demonstrative structure of the period digitalization circuit shown in FIG. 3.
Figure 6:
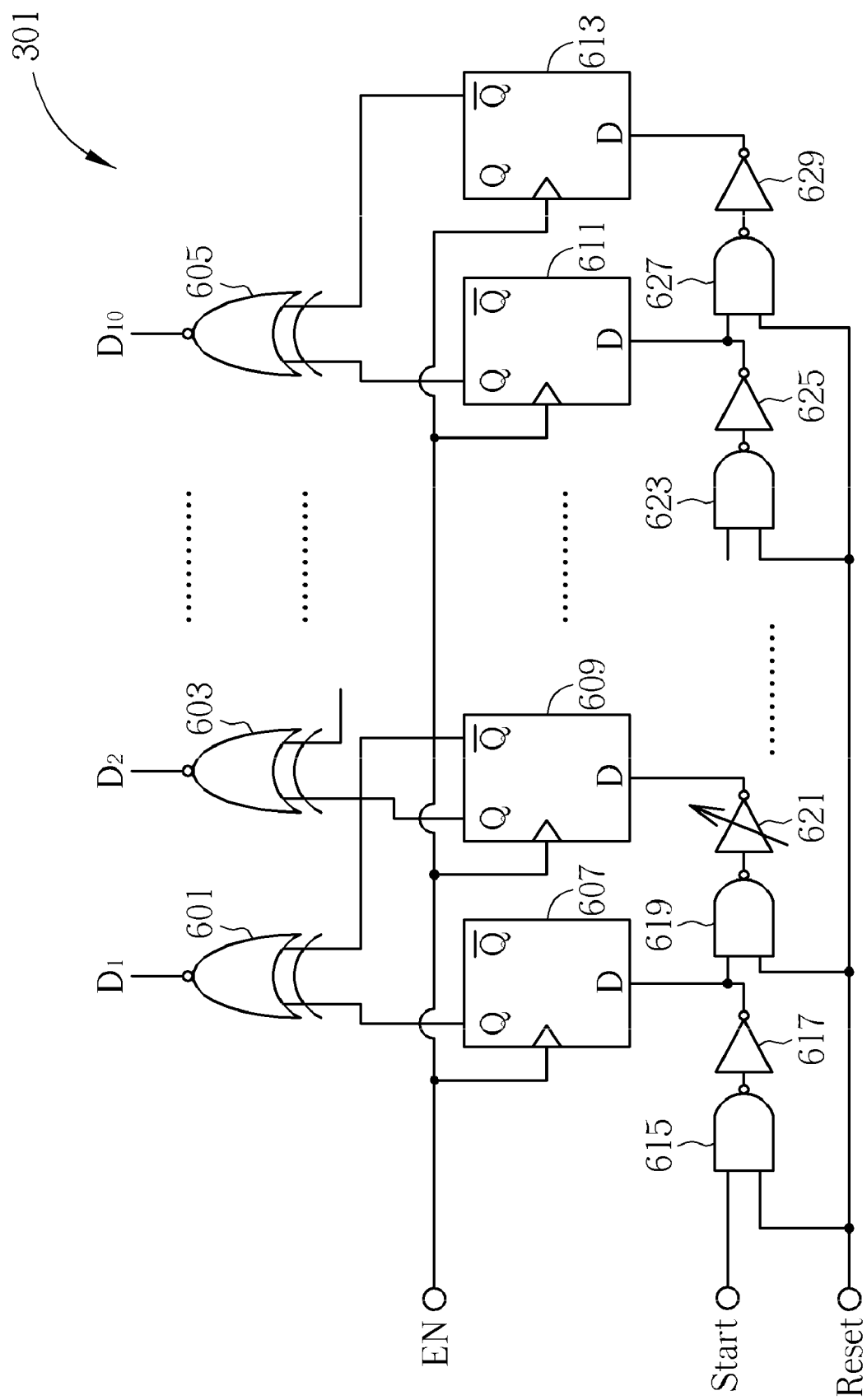
FIG. 6 shows yet another demonstrative structure of the period digitalization circuit shown in FIG. 3.

FIG. 4 shows one demonstrative structure of the period digitalization circuit 301 shown in FIG. 3. FIG. 5 shows another demonstrative structure of the period digitalization circuit 301 shown in FIG. 3. FIG. 6 shows yet another demonstrative structure of the period digitalization circuit 301 shown in FIG. 3. The period digitalization circuit 301 shown in FIG. 4 includes a counter 401, a determining circuit 403, a counter 405, a calculating circuit 409 and an oscillator 411. The determining circuit 403 continuously receives counter values of the counter 401. When the counter value generated by the counter 401 reaches the value M, the calculating circuit 409 reads the value N of the counter 405. Therefore, the calculating circuit 409 may perform calculation according to the following equation (1):

$$T_{ref} = \left(\frac{N}{M}\right) * T_{osc} \qquad (1)$$

where, $T_{ref}$ represents the period of the reference clock signal RCLK, and $T_{osc}$ represents the period of the clock signal OSC generated by the oscillator 411. That is, the ratio of $T_{ref}$ to $T_{osc}$ is $$\frac{N}{M}.$$

Therefore, by using $T_{osc}$ as a basic unit, the period $T_{ref}$ of the reference clock signal RCLK may be digitalized to $$\frac{N}{M}.$$

Alternatively, $T_{osc}$ may be defined as R times as large as a basic unit, and the period $T_{ref}$ of the reference clock signal RCLK may be digitalized as $$\frac{N}{M} \cdot R.$$

This digitalizing process may be performed once or repeated many times.

The period digitalization circuit 301 shown in FIG. 5 is a delay locked loop (DLL). As shown in FIG. 5, the period digitalization circuit 301 includes a phase detector 503, a shift register 505 and a delay line 507. The delay line 507 includes a plurality of delay stages 509-517. Due to this circuit structure, the delay amount between the output clock signal $CLK_{out}$ and the reference clock signal RCLK may be exactly derived. In this way, the period of the reference clock signal RCLK may be digitalized by using one delay stage as a basic unit. The meaning of RCLK shown in FIG. 5 is equivalent to RCLK shown in FIG. 3.

The period digitalization circuit 301 shown in FIG. 6 is a time-to-digital converter. As shown in FIG. 6, the period digitalization circuit 301 includes a plurality of XNOR gates 601-605, a plurality of D type flip-flops 607-613 and a plurality of logic gates 615-629. Due to this circuit structure, it can be known that the whole period is delayed at which stage, so the period of the reference clock signal RCLK may be digitalized by utilizing the logic gates 615 and 617 as the basic unit. The types of the logic gates are not meant to be limitations of the present invention. Any logic gate combination capable of providing a delay amount falls within the scope of the present invention. The determining circuit for determining which stage accomplishes delaying the whole period is also not limited to utilizing XNOR gates 601-605.

As those skilled in the art will readily understand the operating principles of the period digitalization circuits 301 shown in FIG. 4 to FIG. 6, further description is therefore omitted here for brevity. It should be noted that the circuits shown in FIG. 4 to FIG. 6 are for illustrative purposes only. Any circuit structure capable of achieving the function of the period digitalization circuit 301 falls within the scope of the present invention. The exemplary embodiment of the delay circuit 203 may be a replica of the oscillator 411 shown in FIG. 4 with the oscillation condition removed, or a replica of the delay stages 509-517 shown in FIG. 5, or a replica of the logic gates 615-617 shown in FIG. 6, or a modification/combination of the aforementioned exemplary designs. The relation between the delay circuit 203 and the delay stages in period digitalization circuit 301 is not limited here, because the ratio parameter TC may be used to compensate for the relation. Any structure capable of achieving the function of the delay circuit 203 falls within the scope of the present invention.

Figure 7:
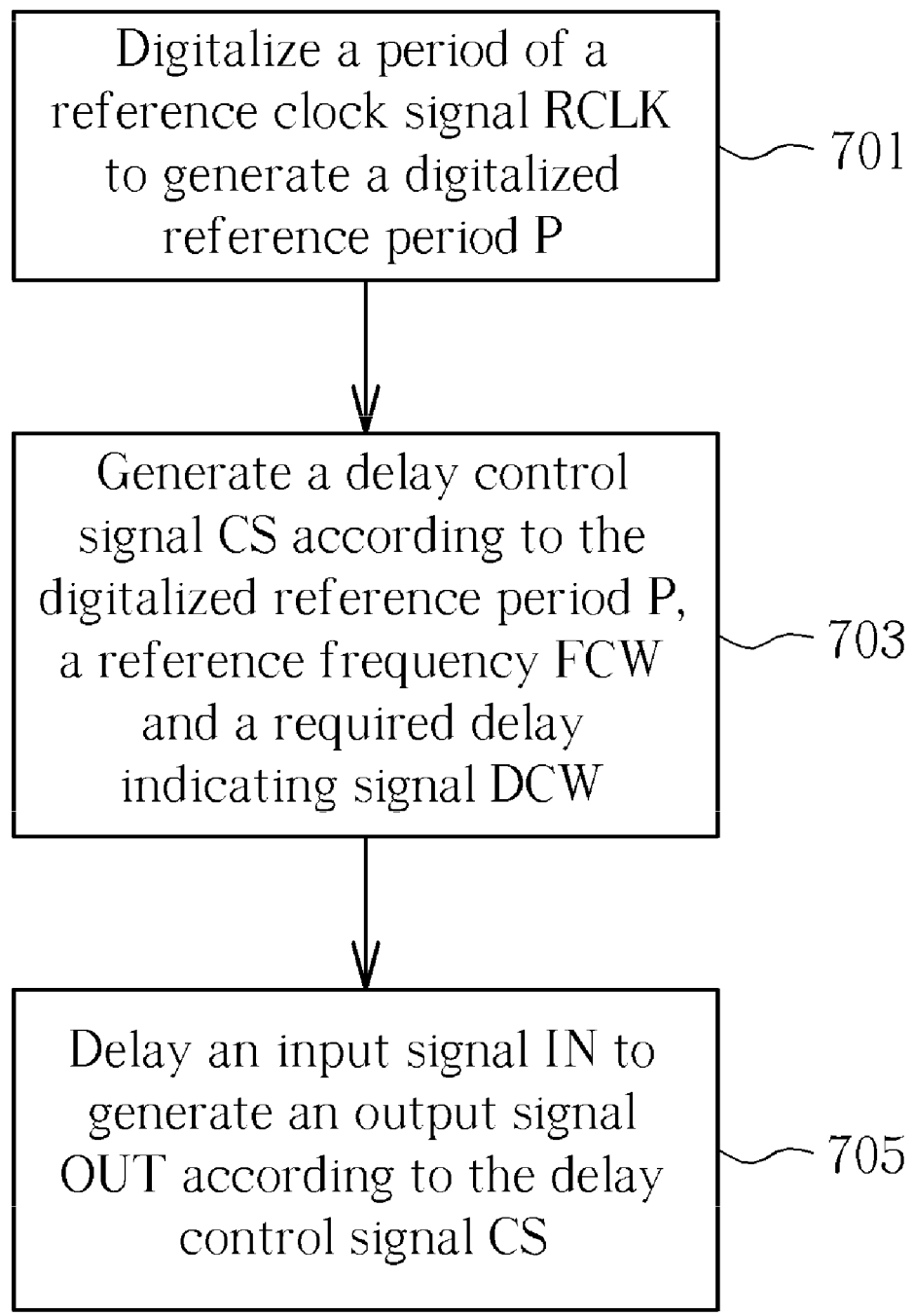
FIG. 7 shows a signal delay method according to an exemplary embodiment of the present invention.

According to the aforementioned exemplary embodiments, the signal delay method shown in FIG. 7 may be derived:

Step 701: Digitalize a period of a reference clock signal RCLK to generate a digitalized reference period P.

Step 703: Generate a delay control signal CS according to the digitalized reference period P, a reference frequency FCW and a required delay indicating signal DCW.

Step 705: Delay an input signal IN to generate an output signal OUT according to the delay control signal CS.

As other detailed steps may be easily derived according to the aforementioned exemplary embodiments, further description is omitted here for brevity.

Figure 1:
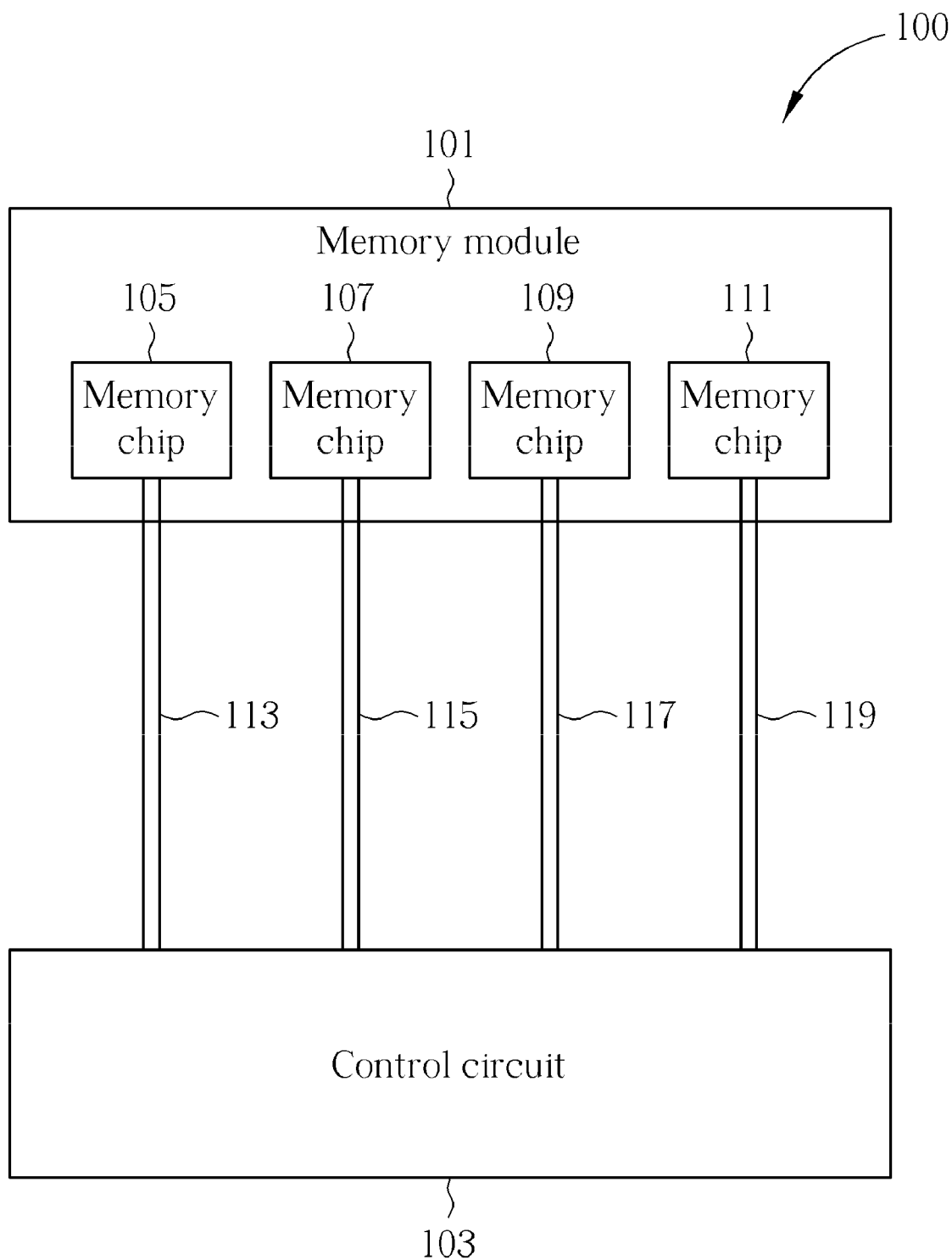
FIG. 1 shows a block diagram of a memory apparatus according to the prior art.

In a case where any of the aforementioned exemplary embodiments is applied to the memory apparatus shown in FIG. 1, it may synchronize the transmission signals within the signal channels 113-119; however, it by no means implies that the signal delay apparatus and the signal delay method of the present invention may be utilized in the memory apparatus shown in FIG. 1 only.

According to the aforementioned exemplary embodiments, the digitalization control circuit may provide an exact delay value, and may simultaneously utilize a plurality of delay circuits and a plurality of delay control signals to control respective delay circuits. Moreover, by utilizing this mechanism, the delay circuit may not be limited to be disposed close to the delay control circuit for decreasing interference between signal transmissions, thereby improving flexibility in circuit design and decreasing the circuit area.

Those skilled in the art will readily observe that numerous modifications and alterations of the device and method may be made while retaining the teachings of the invention.

What is claimed is:

1. A signal delay apparatus, comprising:
   a period digitalization circuit, for digitalizing a period of a reference clock signal to generate a digitalized reference period;
   a delay control signal generator, for generating a delay control signal according to the digitalized reference period, a reference frequency and a required delay indicating signal; and
   a delay circuit, for delaying an input signal to generate an output signal according to the delay control signal.

2. The signal delay apparatus of claim 1, wherein the delay control signal is generated according to a product of the reference frequency, the required delay indicating signal, and the digitalized reference period.

3. The signal delay apparatus of claim 1, wherein the delay circuit comprises at least a delay stage, and the period digitalization circuit further generates a ratio parameter which represents a ratio of the delay stage in period digitalization circuit to a delay amount of the delay stage in delay circuit.

4. The signal delay apparatus of claim 3, wherein the delay control signal is generated according to a product of the reference frequency, the required delay indicating signal, the digitalized reference period, and the ratio parameter.

5. The signal delay apparatus of claim 1, wherein the delay control signal is generated according to a product of the reference frequency and the required delay indicating signal.

6. The signal delay apparatus of claim 1, wherein the delay control circuit transfers a required delay value into the required delay indicating signal according to a mapping table.

7. The signal delay apparatus of claim 1, wherein the delay circuit comprises a plurality of buffers acting as delay stages, and the buffers belong to a plurality of signal channels, respectively.

8. A memory apparatus, comprising:
   a plurality of memory chips;
   a control circuit;
   a plurality of signal channels, wherein the control circuit communicates with the memory chips via the signal channels;
   a delay control circuit, for synchronizing signal transmissions of the signal channels, comprising:
      a period digitalization circuit, for digitalizing a period of a reference clock signal to generate a digitalized reference period; and
      a delay control signal generator, for generating a delay control signal according to the digitalized reference period, a reference frequency and a required delay indicating signal; and
      a delay circuit, for delaying an input signal from a signal channel of the signal channels to generate an output signal to the signal channel according to the delay control signal.

9. The memory apparatus of claim 8, wherein the delay control signal is generated according to a product of the reference frequency, the required delay indicating signal, and the digitalized reference period.

10. The memory apparatus of claim 8, wherein the delay circuit comprises at least a delay stage, and the period digitalization circuit further generates a ratio parameter which represents a ratio of delay stage in period digitalization circuit to a delay amount of the delay stage in delay circuit.

11. The memory apparatus of claim 10, wherein the delay control signal is generated according to a product of the reference clock frequency, the required delay indicating signal, the digitalized reference period, and the ratio parameter.

12. The memory apparatus of claim 8, wherein the delay control signal is generated according to a product of the reference clock frequency and the required delay indicating signal.

13. The memory apparatus of claim 8, wherein the delay control circuit transfers a required delay value into the required delay indicating signal according to a mapping table.

14. The memory apparatus of claim 8, wherein the delay circuit comprises a plurality of buffers acting as delay stages, and the buffers belong to a plurality of signal channels, respectively.

15. A signal delay method, comprising:
digitalizing a period of a reference clock signal to generate a digitalized reference period;
generating a delay control signal according to the digitalized reference period, a reference frequency and a required delay indicating signal; and
controlling a delay circuit according to the delay control signal, for delaying an input signal to generate an output signal.

16. The signal delay method of claim 15, wherein the delay control signal is generated according to a product of the reference clock frequency, the required delay indicating signal, and the digitalized reference period.

17. The signal delay method of claim 15, wherein the delay circuit comprises at least a delay stage, and signal delay method further generates a ratio parameter which represents a ratio of a basic unit of the digitalized reference period to a delay amount of the delay stage in delay circuit.

18. The signal delay method of claim 17, wherein the delay control signal is generated according to a product of the reference clock frequency, the required delay indicating signal, the digitalized reference period, and the ratio parameter.

19. The signal delay method of claim 15, wherein the delay control signal is generated according to a product of the reference clock frequency and the required delay indicating signal.

20. The signal delay method of claim 15, further comprising:
transferring a required delay value into the required delay indicating signal according to a mapping table.

21. The signal delay method of claim 15, wherein the delay circuit comprises a plurality of buffers acting as delay stages, and the buffers belong to a plurality of signal channels, respectively.

* * * * *